(12) United States Patent
Yonezawa et al.

(10) Patent No.: US 7,847,569 B2
(45) Date of Patent: Dec. 7, 2010

(54) PROBE DEVICE AND METHOD OF REGULATING CONTACT PRESSURE BETWEEN OBJECT TO BE INSPECTED AND PROBE

(75) Inventors: Toshihiro Yonezawa, Yamanashi (JP); Syuichi Tsukada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 12/064,167

(22) PCT Filed: Aug. 23, 2006

(86) PCT No.: PCT/JP2006/316488
§ 371 (c)(1), (2), (4) Date: Feb. 19, 2008

(87) PCT Pub. No.: WO2007/023851
PCT Pub. Date: Mar. 1, 2007

(65) Prior Publication Data
US 2009/0284272 A1  Nov. 19, 2009

(30) Foreign Application Priority Data
Aug. 25, 2005  (JP) ............................ 2005-244840

(51) Int. Cl.
G01R 31/02  (2006.01)
G01R 31/26  (2006.01)
(52) U.S. Cl. .................... 324/754; 324/757; 324/158.1
(58) Field of Classification Search .......... 324/754–765
See application file for complete search history.

(56) References Cited

U.S. PATENT DOCUMENTS
4,749,942 A * 6/1988 Sang et al. .................. 324/762

(Continued)

FOREIGN PATENT DOCUMENTS
JP  04-320969 A  11/1992

(Continued)

OTHER PUBLICATIONS
Korean Office action for 10-2008-7003711 dated Jan. 28, 2010.
Japanese Office action for 2005-244840 dated Jun. 1, 2010.

Primary Examiner—Ha Tran T Nguyen
Assistant Examiner—Emily Y Chan
(74) Attorney, Agent, or Firm—Pearne & Gordon LLP

(57) ABSTRACT

Contact pressure between a wafer and a probe is maintained at an appropriate level. A probe card 2 has a contactor 11 for supporting a probe 10, a printed wiring board 13 electrically connected to the contactor 11, and a reinforcement member 14. On the upper surface side of the probe card 2 is provided a top plate 70 connected to the reinforcement member 14 by a connection member 80. A groove 90 is formed in the upper surface of the top plate 70, and a strain gauge 91 is attached at the groove 90. When a wafer W and the probe 10 are in contact with each other, an upward load acts on the probe card 2 by pressure caused by the contact, and the load causes strain in the top plate 70. The amount of the strain in the top plate 70 is measured, and contact pressure between the wafer W and the probe 10 is regulated and set based on the amount of the strain.

7 Claims, 7 Drawing Sheets

U.S. PATENT DOCUMENTS

| | | | | |
|---|---|---|---|---|
| 5,939,893 | A * | 8/1999 | Elsner et al. | 324/761 |
| 6,137,299 | A * | 10/2000 | Cadieux et al. | 324/757 |
| 7,262,618 | B2 * | 8/2007 | Komatsu | 324/758 |
| 2008/0048698 | A1 * | 2/2008 | Amemiya et al. | 324/758 |

FOREIGN PATENT DOCUMENTS

JP    10-010156 A    1/1998

* cited by examiner

PROBE DEVICE AND METHOD OF REGULATING CONTACT PRESSURE BETWEEN OBJECT TO BE INSPECTED AND PROBE

TECHNICAL FIELD

The present disclosure relates to a probe device for inspecting electrical characteristics of a target object to be inspected as a wafer or the like; and also relates to a method of regulating a contact pressure between the target object and a probe.

BACKGROUND ART

For example, inspection of electrical characteristics of electronic circuits such as an integration circuit (IC), a large scale integration (LSI) circuit or the like formed on a semiconductor wafer has been conventionally carried out by using a probe device having a probe card. The probe card typically includes a contactor sustaining thereon a number of probes; and a circuit board electrically connected to the contactor. The contactor is disposed in a manner that its lower surface, on which the probes are supported, faces the wafer, and the circuit board is superposed on a top surface of the contactor so that an electrical contact between the circuit board and the contactor may be maintained. The inspection of the electrical characteristics of the wafer is carried out by bringing the probes into contact with individual electrodes of the electronic circuits on the wafer and then transmitting electric signals for inspection to the electrodes on the wafer from the probes through the circuit board and the contactor.

To inspect the electrical characteristics of the wafer properly, the probes and the electrodes need to be brought into contact with each other so that a contact resistance therebetween may be reduced sufficiently. That is, the probes and the electrodes need to be brought into contact with each other at a sufficient contact pressure. Conventionally, a contact between the probes and the wafer is made by moving up the wafer toward the probe card by a specific distance, and a contact pressure between the probes and the wafer is set by the preset movement distance of the wafer (see, for example, Patent Reference 1).

[Patent Reference 1]

Japanese Patent Laid-open Application No. 2004-265895

DISCLOSURE OF THE INVENTION

Problems to Be Solved by the Invention

However, in case that the contact pressure between the probes and the wafer is set by the movement distance of the wafer as in the prior art, an actual contact pressure during an inspection may be indefinite, and there may be a likelihood that a proper contact pressure may not be obtained for some reasons if the inspection is repeated multiple times. Accordingly, if the contact pressure is determined by the movement distance of the wafer as in the prior art, reliability of inspection results cannot be obtained sufficiently. Furthermore, since the movement distance of the wafer should be calculated and set in advance through an experiment or the like, it takes a considerable amount of time to set the proper movement distance.

In view of the foregoing, it is an object of the present disclosure to improve reliability of inspection of electrical characteristics of a target object such as a wafer or the like by allowing the target object to be brought into contact with probes at a proper contact pressure. Further, it is another object of the present disclosure to regulate a contact pressure between the target object and the probes for a short period of time.

Means for Solving the Problems

In order to accomplish the object, in accordance with one aspect of the present invention, there is provided a probe device for inspecting electrical characteristics of a target object to be inspected including: a contactor supporting probes on a surface facing the target object; a probe card having a circuit board electrically connected to the contactor; a strain member strained by a load applied to the probe card due to a contact between the probes and the target object; and a strain measuring member for measuring a strain amount of the strain member.

In the above probe device, since it is possible to deform the strain member depending on a contact pressure between the probes and the target object, the strain amount dependent upon the actual contact pressure can be detected. Accordingly, by regulating the contact pressure between the probes and the target object based on the detected amount of the strain, for example, the contact between the probes and the target object can be set at an appropriate contact pressure. Moreover, since the contact pressure can be simply calculated from the strain amount, the regulation or setting of the contact pressure can be carried out for a short period of time.

The strain member may be provided at a distinct surface side of the probe card opposite to the surface facing the target object.

Further, a gap may be provided between the strain member and the distinct surface of the probe card, and the strain member may be connected to the distinct surface of the probe card by a connection member.

Furthermore, the connection member may be disposed at plural locations symmetric with respect to a center of the probe card when viewed from the top.

In addition, the probe card may include a reinforcement member for supporting the probe card on the distinct surface side of the probe card, and the connection member may connect the reinforcement member with the strain member.

Moreover, the strain measuring member may be mounted on the strain member to be located outside the connection member with respect to the center of the probe card when viewed from the top.

Further, the strain member may be provided with a stress concentration part to which a stress due to a load applied to the probe card is concentrated and the strain measuring member may be mounted on the stress concentration part.

Furthermore, the stress concentration part formed on the strain member may be an annular groove which is concentric with the probe card when viewed from the top, and the strain measuring member may be mounted at plural locations on the groove at a same interval.

In accordance with another aspect of the present invention, there is provided a method of regulating a contact pressure between a target object to be inspected and probes, including: allowing the probes and the target object to be brought in contact with each other; measuring a strain amount of a specific member to which a load is applied due to the contact between the probes and the target object; and regulating the contact pressure between the probes and the target object based on the strain amount of the specific member.

EFFECT OF THE INVENTION

In accordance with the present invention, reliability of inspection of electrical characteristics of the target object can be improved. Furthermore, the regulation of the contact pressure between the target object and the probes can be carried out for a short period of time.

Figure 1:
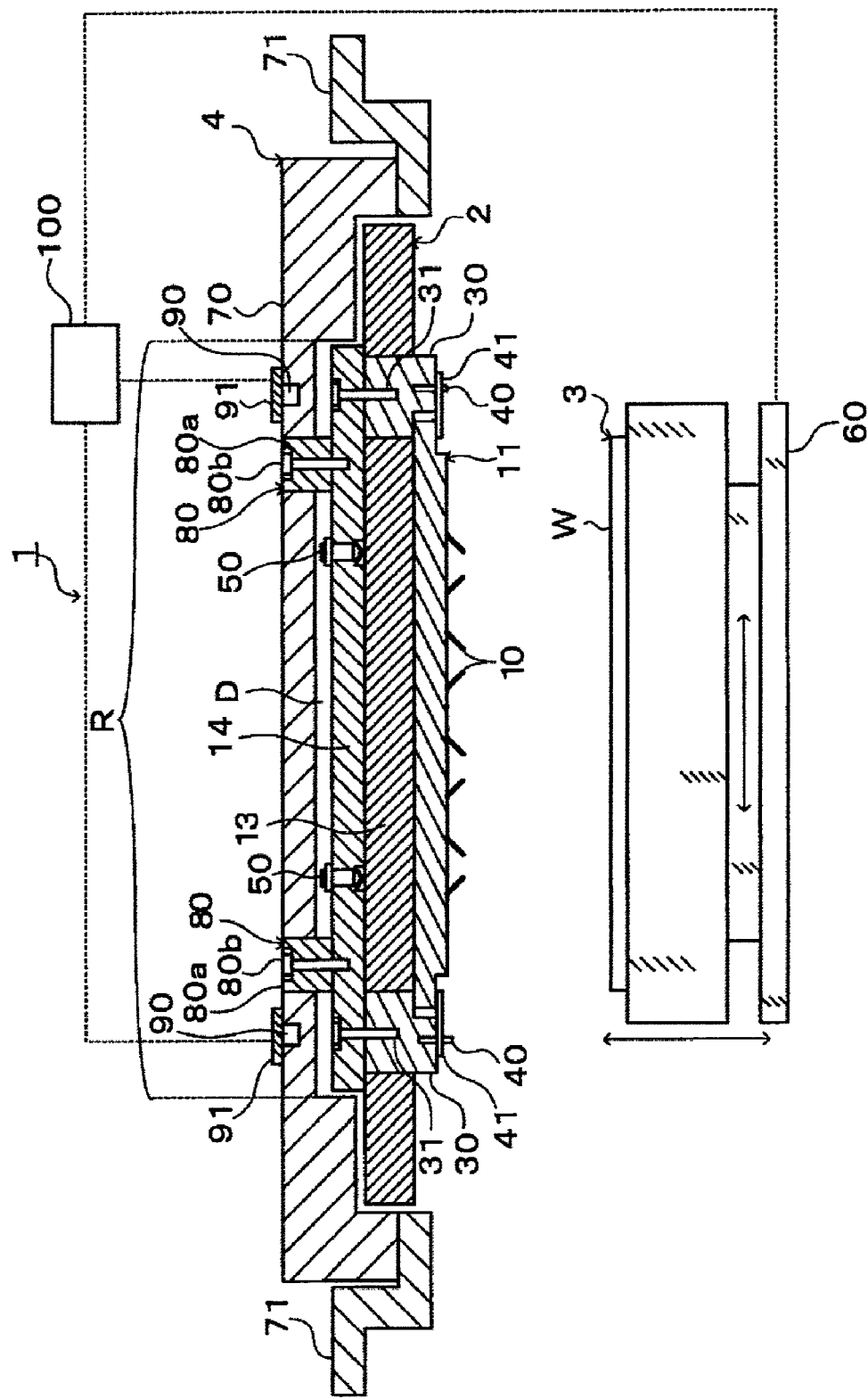
FIG. 1 A longitudinal cross sectional view showing a schematic configuration of a probe device.

EXPLANATION OF CODES 1 probe device
2 probe card
10 probes
11 contactor
13 printed wiring board
14 reinforcement member
70 top plate
80 connection member
90 groove
91 strain gauge
W wafer

BEST MODE FOR CARRYING OUT THE INVENTION

Hereinafter, an embodiment of the present invention will be described. FIG. 1 is a longitudinal cross sectional view showing a schematic internal configuration of a probe device 1 in accordance with the embodiment of the present invention.

The probe device 1 includes, for example, a probe card 2; a mounting table 3 for mounting thereon a wafer W which is a target object to be inspected; and a card holder 4 for holding the probe card 2.

The probe card 2 is formed in, for example, a substantially disk-like shape as a whole. The probe card 2 includes a contactor 11 sustaining a plurality of probes 10 thereon; a printed wiring board 13 electrically connected with the contactor 11; and a reinforcement member 14 for reinforcing the printed wiring board 13.

The contactor 11 is formed in, for example, a substantially rectangular plate shape, and is disposed on a lower side of the probe card 2 to face the mounting table 3. The plurality of probes 10 are connected to and supported on a bottom surface of the contactor 11. Inside the contactor 11, there is formed connection wiring which connects each probe 10 to the printed wiring board 13 electrically.

The printed wiring board 13 is formed in, for example, a substantially disk-like shape, and is disposed on top of the contactor 11 in parallel thereto. Formed inside the printed wiring board 13 is wiring for transmitting electrical signals between a test head (not shown) and the contactor 11.

The reinforcement member 14 has, for example, a substantially disk-like shape, and is disposed on a top surface side of the printed wiring board 13 in parallel thereto.

Fixed on, for example, a bottom surface of a peripheral portion of the reinforcement member 14 are joint members 30 for connecting and integrating the contactor 11, the printed wiring board 13 and the reinforcement member 14 as one body. The joint members 30 are fastened by bolts 31 which are inserted through the reinforcement member 14 in a thickness direction thereof from, for example, a top surface side of the reinforcement member 14.

The joint members 30 are formed in, for example, substantially rectangular and vertically elongated pillar shapes, and they are installed at plural, for example, four locations at, for example, a peripheral portion of the contactor 11. When viewed from the top, the joint members 30 are arranged at a same interval along a circumference of a circle having a common center with the contactor 11.

The joint members 30 penetrate, for example, the printed wiring board 13 in a thickness direction thereof such that their lower ends reach the outside of the peripheral portion of the contactor 11. A plate spring 41 is fixed on a bottom surface of each joint member 30 by a bolt 40. While sustaining the peripheral portion of the contactor 11 from below, the plate springs 41 serve to press the contactor 11 toward the printed wiring board 13, thus allowing an electrical contact between the contactor 11 and the printed wiring board 13 to be maintained.

Installed in the reinforcement member 14 are parallelism control screws 50 which are inserted through the reinforcement member 14 in a thickness direction thereof from, for example, the top surface side of the reinforcement member 14 to reach the top surface of the printed wiring board 13. The parallelism control screws 50 are disposed at plural locations in the surface of the reinforcement member 14. By turning each parallelism control screw 50, a distance by which each parallelism control screw 50 presses the top surface of the printed wiring board 13 is adjusted, so that the parallelism of the printed wiring board 13 can be regulated.

The mounting table 3 is configured to be movable in left and right directions and in up and down directions by, for example, a driving unit 60. The mounting table 3 is capable of moving a wafer W mounted thereon three-dimensionally, thus bringing a desired portion of the wafer W into contact with the probes 10.

The card holder 4 includes, for example, a top plate 70 covering the top surface of the probe card 2 as a strain member and a specific member; and a holder 71 supporting a peripheral portion of the top plate 70 and connected to a main body of the probe device 1.

The top plate 70 is formed in, for example, a substantially disk-like shape. For example, the top plate 70 is provided with a recessed portion on a bottom surface thereof, and an upper side of the probe card 2 is accommodated in the recessed portion. Further, a gap D is provided between the top plate 70 and the probe card 2. A central portion R of the top plate 70 which faces the top surface of the reinforcement member 14 is, for example, a flat plate having a uniform thickness, and is provided in parallel with the reinforcement member 14.

The top plate 70 is connected to the reinforcement member 14 by a plurality of, for example, eight connection members 80. The connection members 80 are fixed at, for example, the central portion R of the top plate 70. Each connection member 80 includes a substantially cylindrical connection part 80a which extends from the inside of the central portion R to the top surface of the reinforcement member 14; and a bolt 80b which extends from the top surface of the top plate 70 to the inside of the reinforcement member 14 through the connection part 80a.

Figure 2:
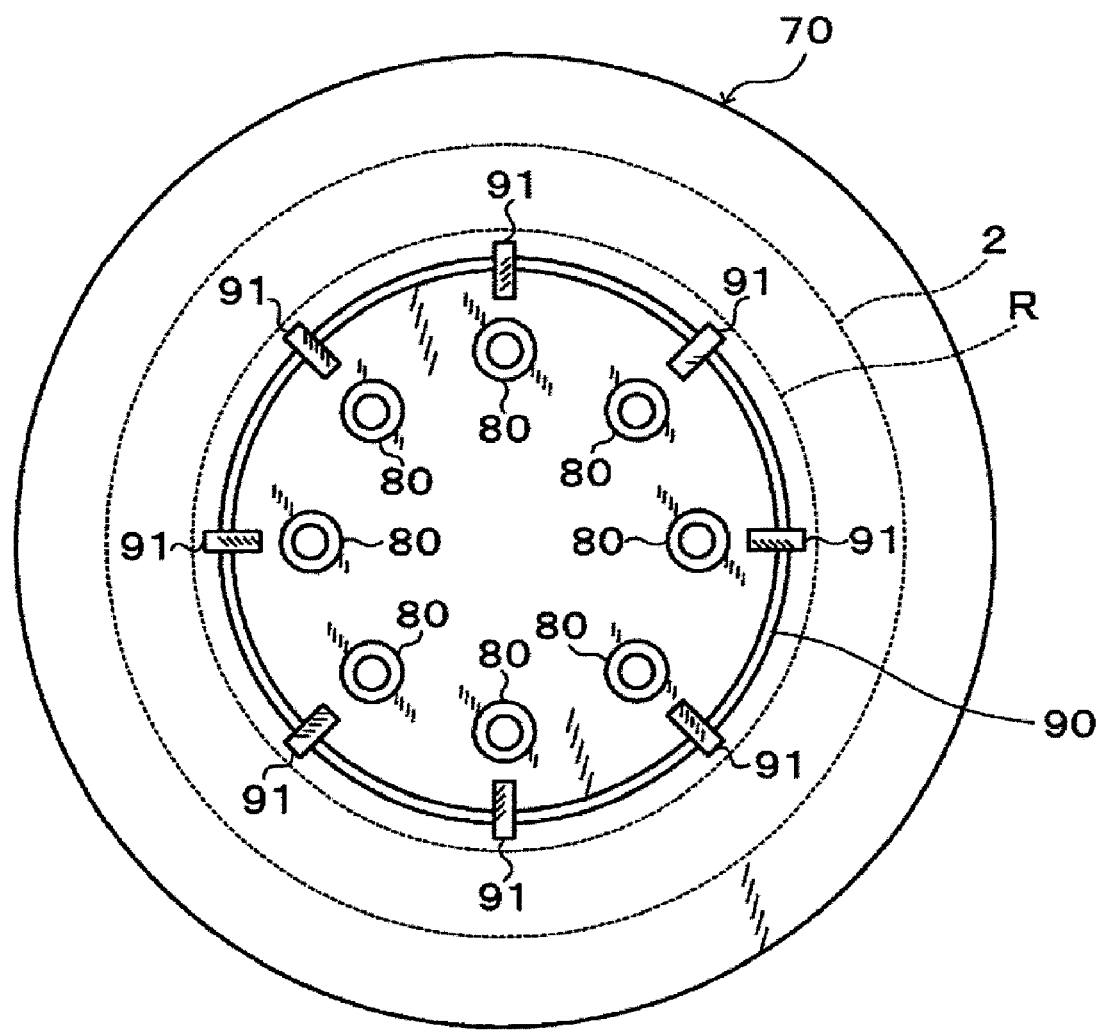
FIG. 2 A top view of a top plate.

Referring to FIG. 2, the connection members 80 are arranged at, for example, eight equi-distanced locations on a circumference of a circle which is concentric with the top plate 70 (concentric with the probe card 2), when viewed from the top. Accordingly, when viewed from the top, the connection members 80 are disposed at symmetric positions with respect to the center of the probe card 2. For example, each connection member 80 is disposed at a position above the peripheral portion of the contactor 11 and at a position corresponding to the peripheral portion of the contactor 11, as shown in FIG. 1.

Formed on a top surface of the central portion R of the top plate 70 is an annular groove 90 which is concentric with the top plate 70, as shown in FIG. 1 and FIG. 2, wherein the groove 90 functions as a stress concentration part. When viewed from the top, the groove 90 is formed at a position outside and adjacent to the connection members 80. Here, the groove 90 may not be annularly shaped as a whole; instead, individual grooves may be formed at plural, for example, eight locations on a circumference of a circle which is concentric with the top plate 70.

On the groove 90, there are installed strain gauges 91 that are used as strain amount measuring members. The strain gauges 91 are installed at, for example, eight locations on the circumference of the groove 90 at a same interval, and each strain gauge 91 is laid across the groove 90 in a widthwise direction thereof. Thus, when the probe card 2 receives a load imposed thereon in an upward direction due to a contact between the probes 10 and the wafer W, it is possible to measure a strain amount of the top plate 70 which is upwardly pressed and strained by the load.

Measurement results of the strain gauge 91 can be outputted to, for example, a control unit 100, as shown in FIG. 1. The control unit 100 is capable of adjusting a movement amount of the mounting table 3 by controlling an operation of the driving unit 60. Further, the control unit 100 is capable of calculating a contact pressure between the probes 10 and the wafer W based on, for example, the measured strain amount. The control unit 100 is further capable of regulating the contact pressure between the probes 10 and the wafer W by varying a distance by which the wafer W presses the probes 10 based on the contact pressure thus calculated.

The top plate 70 is fixed to the holder 71 by bolts (not shown) which are inserted through the top plate 70 from a top surface of a peripheral portion of the top plate 70 in the thickness direction thereof. The holder 71 is fastened to the main body (not shown) of the probe device 1.

When an inspection of electrical characteristics of a wafer W is carried out by the probe device 1 configured as described above, the wafer W is first mounted on the mounting table 3. Subsequently, the mounting table 3, for example, is moved so as to bring the wafer W close to the probe card 2, and then individual electrodes on the wafer W are pressed and brought into contact with the probes 10. Then, electric signals for inspection are transmitted to the wafer W through the printed wiring board 13, the contactor 11 and the probes 10, whereby electrical characteristics of electric circuits of the wafer W are inspected.

Figure 3:
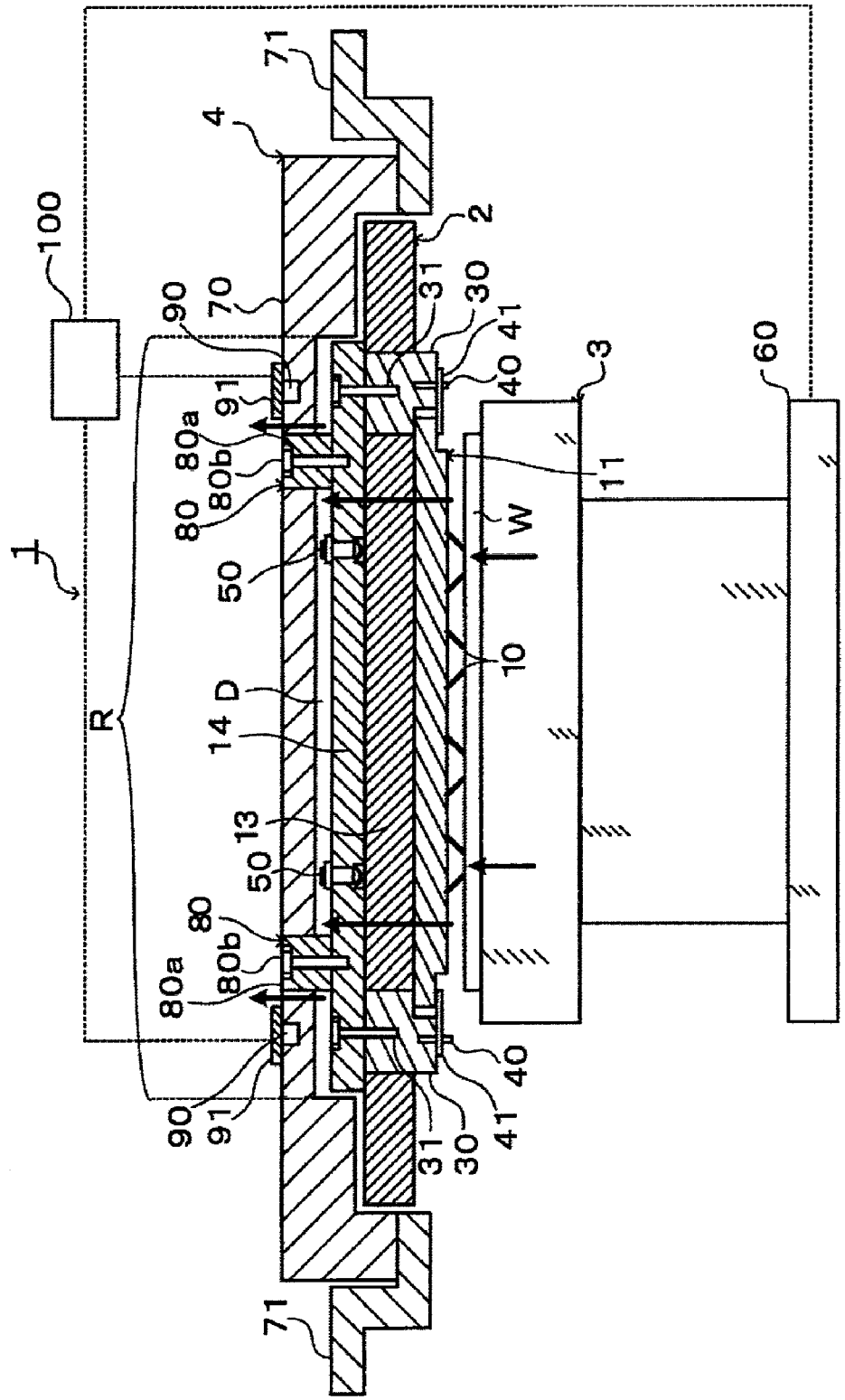
FIG. 3 A longitudinal cross sectional view showing a schematic configuration of the probe device when a wafer is brought into contact with probes.
Figure 4:
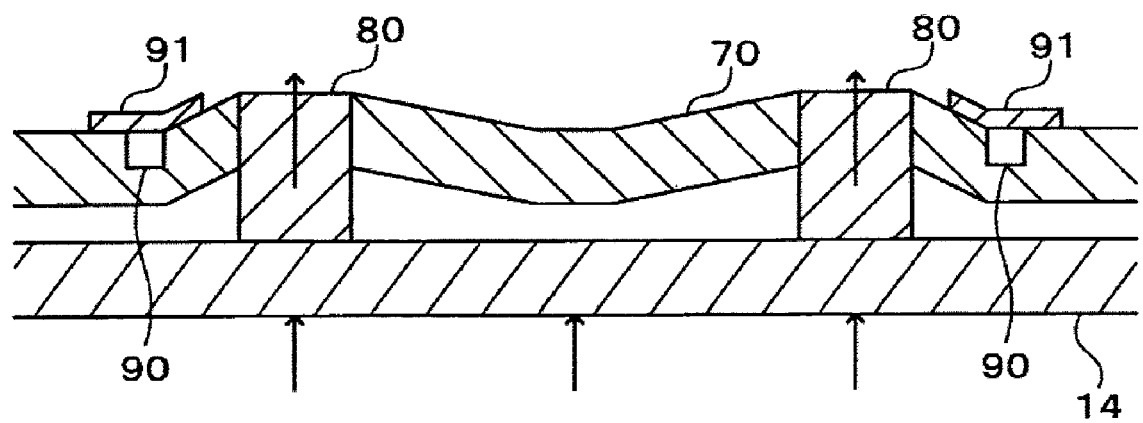
FIG. 4 A schematic diagram to describe a state where the top plate is strained.

When a contact pressure between the probes 10 and the wafer W is regulated, the wafer W is pressed against the probes 10 to be in contact with them, as shown in FIG. 3. Due to this contact, an upward load is applied to the probe card 2 and transmitted to the top plate 70 via the connection members 80. Due to the load applied thereto, the top plate 70 is strained in an upward direction, as illustrated in FIG. 4. At this time, stress applied to the top plate 70 is concentrated to the vicinity of the groove 90. Subsequently, a strain amount of the groove 90 of the top plate 70 is measured by the strain gauges 91. The strain amount thus measured is outputted to the control unit 100, and a contact pressure between the wafer W and the probes 10 is calculated by the control unit 100 based on the measured strain amount. To be more specific, the calculation of the contact pressure may include the steps of, for example, calculating a total amount of load applied to the top plate 70 based on the strain amount; dividing the total load by the number of the probes 10; and then dividing again the divided total load by an area of a tip end of each probe 10, to thereby obtain an average contact pressure between each probe 10 and the wafer W. Then, the control unit 100 adjusts the distance by which the wafer W presses the probes 10 by moving the wafer W in up and down directions based on the average contact pressure thus calculated, to thereby regulate the average contact pressure at a desired level.

In accordance with the embodiment of the present invention described above, since the top plate 70 is mounted on the top surface side of the probe card 2 and the strain gauges 91 are mounted on the top plate 70, it is possible to measure the strain amount of the top plate 70 by deforming the top plate 70 depending on the contact pressure between the wafer W and the probes 10. Then, the contact pressure between the wafer W and the probes 10 can be regulated based on the strain amount. In such case, since the contact pressure between the wafer W and the probes 10 can be regulated based on the strain amount which is dependent upon an actual contact pressure therebetween, it is possible to control the contact pressure more accurately and securely and to cope with a fluctuation of the contact pressure more rapidly and flexibly. Besides, since the actual contact pressure is directly measured by the strain gauges 91, a regulation or setting of the contact pressure can be carried out for a short period of time.

Since the top plate 70 provided with the strain gauges 91 is installed on the top surface side of the probe card 2, the top plate 70 can be directly strained by the load applied from the wafer W toward the probes 10 in the upward direction. Thus, accurate detection of the strain amount, which is dependent upon the contact pressure between the probes 10 and the wafer W, becomes possible.

In accordance with the embodiment of the present invention described above, since the top plate 70 and the probe card 2 are coupled by the connection members 80, the load applied to the probe card 2 can be transmitted to and concentrated to the proper positions of the top plate 70. Accordingly, it is possible to deliver the load applied to the probe card 2 to the top plate 70 appropriately, thereby deforming the top plate 70.

Since the connection members 80 are arranged symmetrically with respect to the center of the probe card 2 when viewed from the top, the load applied to the probe card 2 can be uniformly transmitted to the top plate 70.

Since the annular groove 90 is formed on the top surface of the top plate 70 and the strain gauges 91 are mounted on the groove 90, it is possible to concentrate the stress inflicted on the top plate 70 to the vicinity of the groove 90 and to measure the strain of that area. As a result, the strain amount, which is dependent upon the load applied to the probe card 2 from the wafer W, can be measured accurately.

Since the strain gauges 91 are arranged on the groove 90 at the same interval, it is also possible to detect a deviation of contact pressures in the surface of the wafer W, for example.

Figure 5:
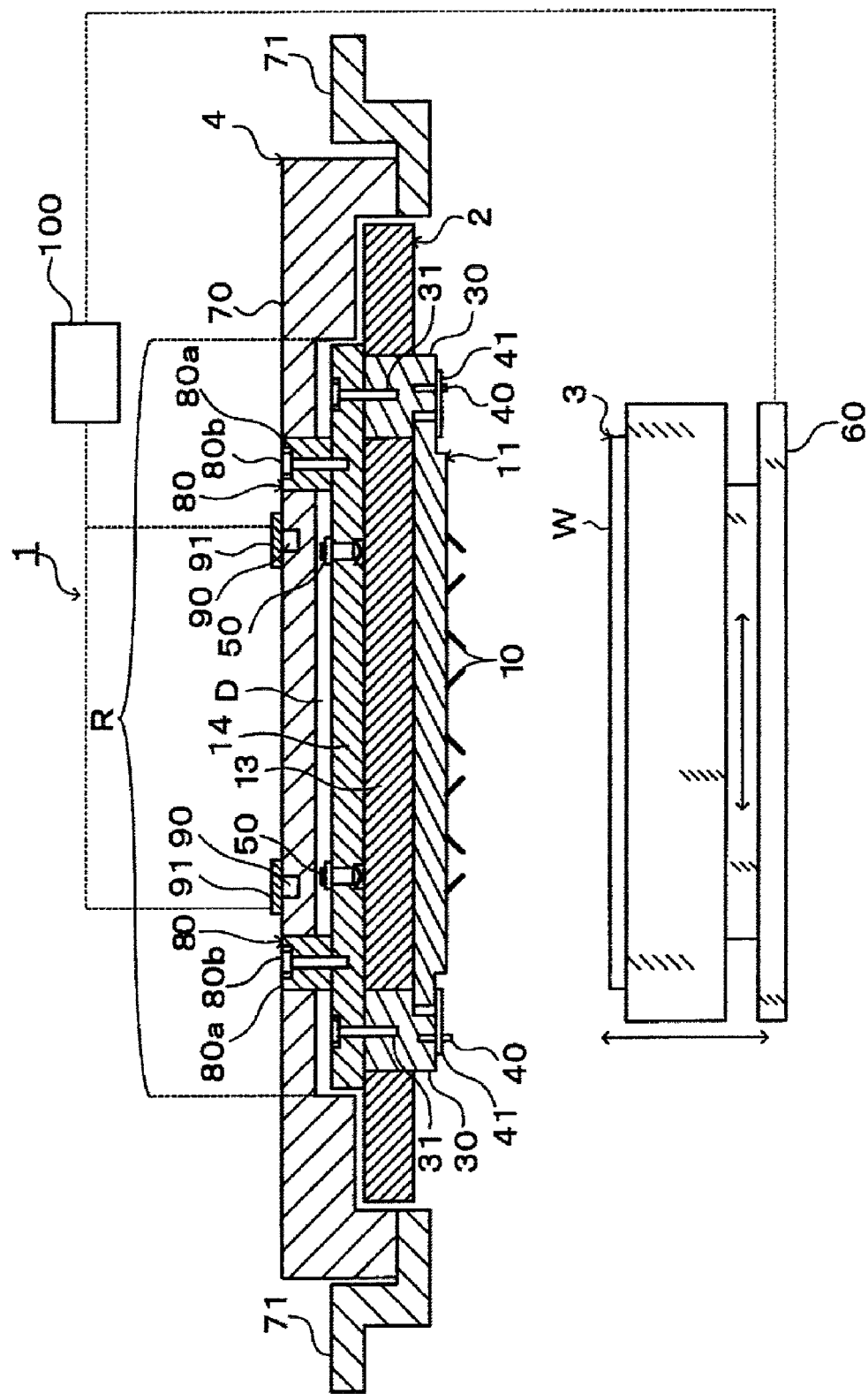
FIG. 5 A longitudinal cross sectional view showing a configuration of a probe device in which a groove is provided inside connection members.
Figure 6:
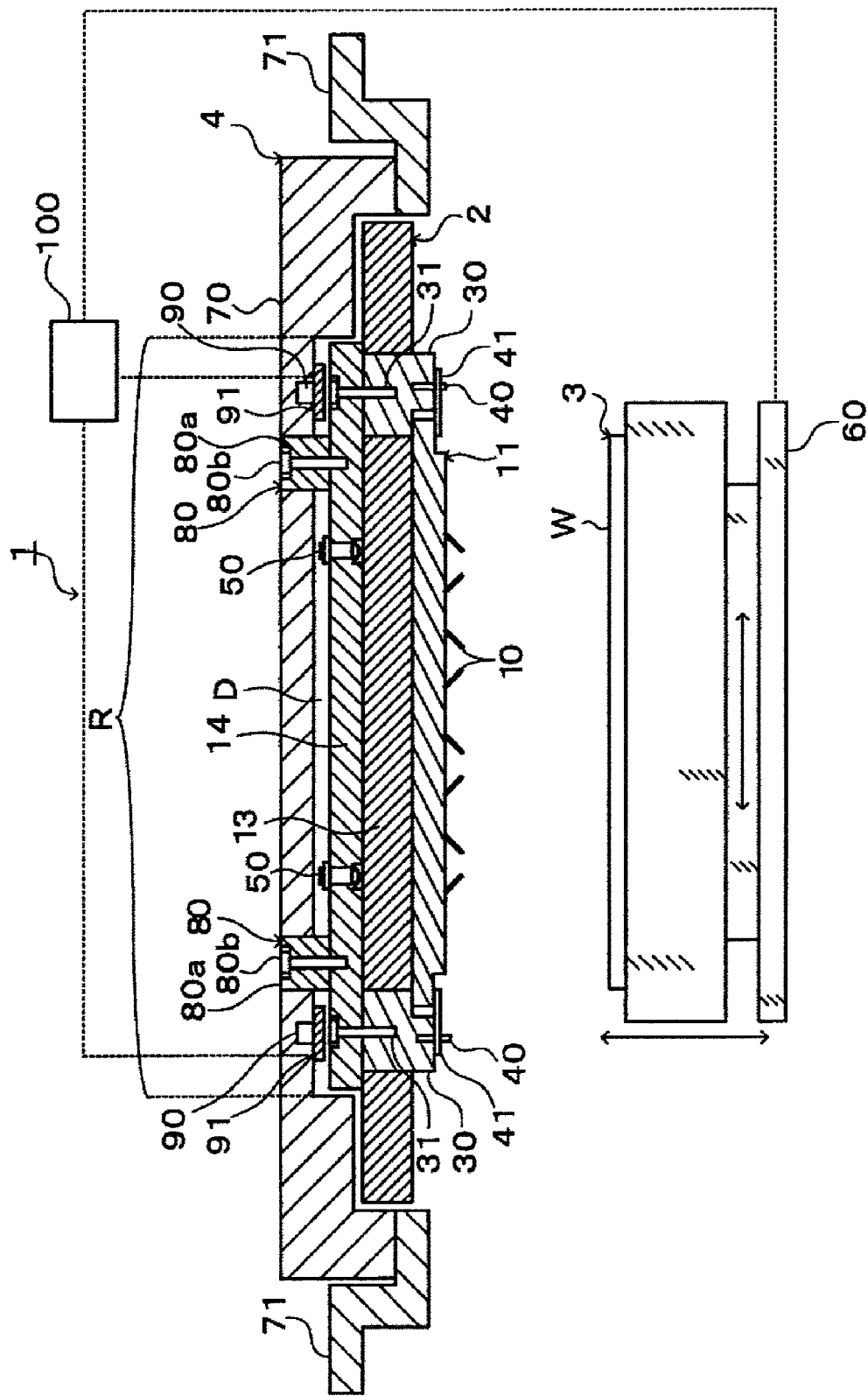
FIG. 6 A longitudinal cross sectional view showing a configuration of a probe device in which a groove is provided on a bottom surface of a top plate.
Figure 7:
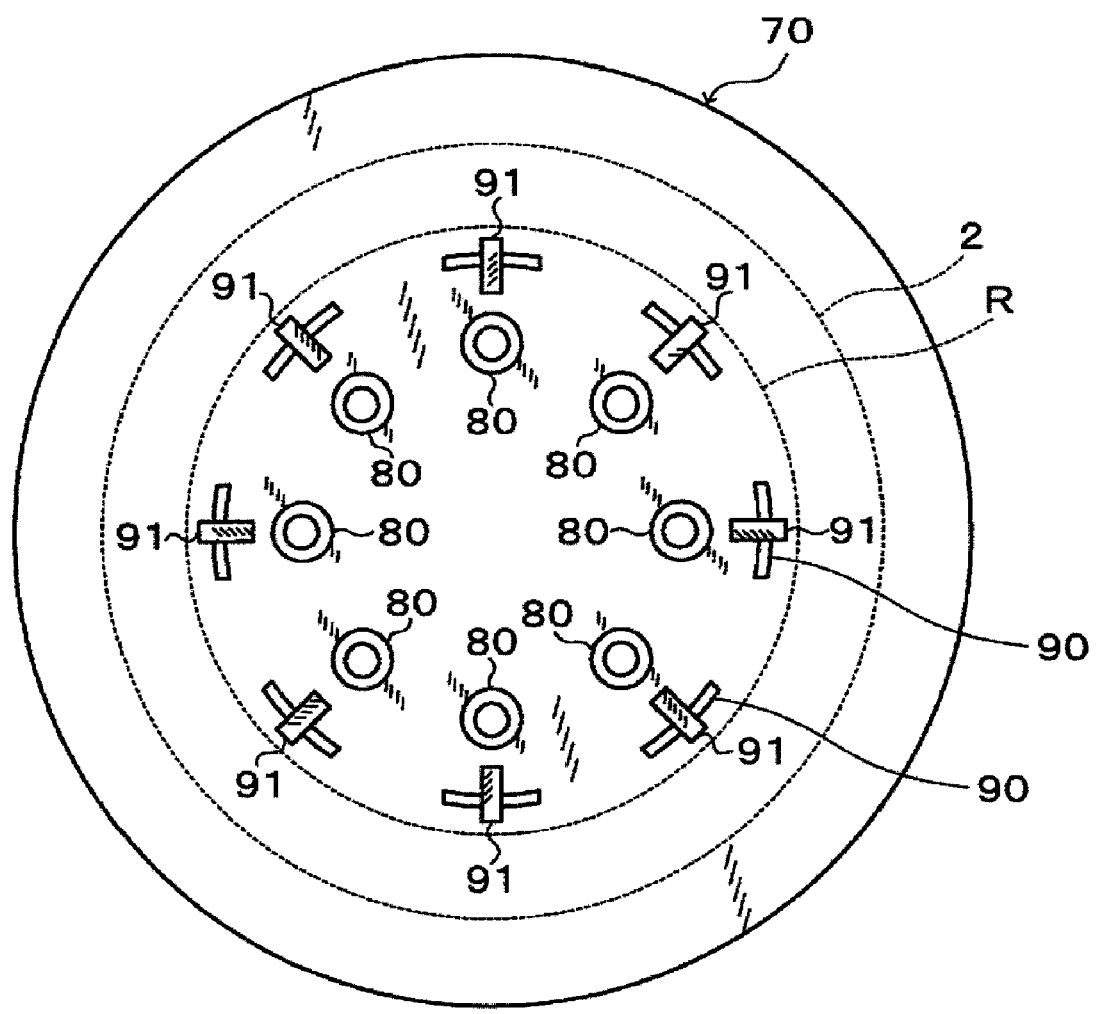
FIG. 7 A top view of a top plate where grooves are formed in circular arc shapes.

Though the embodiment of the present invention has been described for the case of providing the groove 90 and the strain gauges 91 outside the connection members 80 when viewed from the top, it is also possible to provide them inside the connection members 80, as illustrated in FIG. 5. Furthermore, the groove 90 and the strain gauges 91 can be provided on a bottom surface side of the top plate 70, as shown in FIG. 6. Though the groove 90 is formed in the annular shape in the embodiment, it is also possible to form circular arc-shaped grooves only at portions where the strain gauges 91 are mounted, as illustrated in FIG. 7. In addition, it is also possible to form another shape such as a hole or the like in the top plate 70 instead of the groove 90 as long as that can function as a stress concentration part.

While the invention has been described with respect to the embodiment given in conjunction with the accompanying drawings, the present invention is not limited thereto. It shall be understood by those skilled in the art that various changes and modifications may be made without departing from the scope of the invention defined in the claims and that all the changes and modifications are included in the scope of the present invention. For example, in the above-described embodiment, the number or the arrangement of the connection members 80, the strain gauges 91 or the like can be selected arbitrarily. Further, the strain gauges 91 can be mounted on an element other than the top plate 70 as long as that element can be strained by the load applied to the probe card 2. The strain gauges 91 can be formed in a length equivalent to the diameter of the central portion R of the top plate 70 and disposed on the diameter of the central portion R. Further, the shape of the top plate 70 is not limited to the disk shape, but it may be of, for example, a rectangular plate shape. Moreover, instead of the top plate 70, an elongated narrow bar-shaped member can be used as the strain member. In addition, the present invention can also be applied to a case without having the reinforcement member 14. Also, the present invention can be applied to a case where the target object to be inspected is not the wafer W but is, for example, another type of substrate such as a flat panel display (FPD) or the like.

INDUSTRIAL APPLICABILITY

The present disclosure ensures a proper contact pressure between a target object to be inspected and probes, so the present invention has many advantages when improving the reliability of inspection of electrical characteristics of the target object.

What is claimed:

1. A probe device for inspecting electrical characteristics of a target object to be inspected comprising:
    a contactor supporting probes on a surface facing the target object;
    a probe card having a circuit board electrically connected to the contactor;
    a strain member strained by a load applied to the probe card due to a contact between the probes and the target object;
    a strain measuring member for measuring a strain amount of the strain member,
    wherein the strain member is positioned at a side of a first surface of the probe card opposite to a second surface facing the target object; and
    wherein a gap is provided between the strain member and the first surface of the probe card, and the strain member is connected to the first surface of the probe card by a connection member.

2. The probe device of claim 1, wherein the connection member is disposed at plural locations symmetric with respect to a center of the probe card when viewed from the top.

3. The probe device of claim 1, wherein the probe card includes a reinforcement member for supporting the probe card on the side of the first surface of the probe card, and the connection member connects the reinforcement member with the strain member.

4. The probe device of claim 1, wherein the strain measuring member is mounted on the strain member to be located outside the connection member with respect to the center of the probe card when viewed from the top.

5. The probe device of claim 1, wherein the strain member is provided with a stress concentration part to which a stress due to a load applied to the probe card is concentrated and the strain measuring member is mounted on the stress concentration part.

6. The probe device of claim 5, wherein the stress concentration part formed on the strain member is an annular groove which is concentric with the probe card when viewed from the top, and the strain measuring member is mounted at plural locations on the groove at a same interval.

7. A method of regulating a contact pressure between a target object to be inspected and probes by using a probe device as claimed in any one of claims 1 and 2 to 6, the method comprising:
    allowing the probes and the target object to be brought into contact with each other;
    measuring a strain amount of a strain member to which a load is applied due to the contact between the probes and the target object; and
    regulating the contact pressure between the probes and the target object based on the strain amount of the strain member.

* * * * *